(12) United States Patent
Nagaoka

(10) Patent No.: US 6,891,463 B2
(45) Date of Patent: May 10, 2005

(54) MOUNTING STRUCTURE OF FUSE CONNECTION TERMINALS ON BOARD

(75) Inventor: Yasutaka Nagaoka, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/345,183

(22) Filed: Jan. 16, 2003

(65) Prior Publication Data

US 2003/0133273 A1 Jul. 17, 2003

(30) Foreign Application Priority Data

Jan. 17, 2002 (JP) ................................. P2002-008976

(51) Int. Cl.[7] ...................... H01H 85/143; H01H 85/20
(52) U.S. Cl. ......................... 337/187; 337/198; 439/250
(58) Field of Search ................. 337/187, 186, 337/194, 198; 439/250, 366, 621, 622, 830, 890, 849, 850

(56) References Cited

U.S. PATENT DOCUMENTS

| | | | | | |
|---|---|---|---|---|---|
| 4,556,274 | A | * | 12/1985 | Olivera | 439/621 |
| 4,943,248 | A | * | 7/1990 | Colleran et al. | 439/850 |
| 5,752,856 | A | | 5/1998 | Boutin et al. | |
| 5,928,004 | A | * | 7/1999 | Sumida et al. | 439/76.2 |
| 6,000,952 | A | * | 12/1999 | Gladd et al. | 439/76.2 |
| 6,011,319 | A | * | 1/2000 | Kelly et al. | 307/10.1 |
| 6,015,302 | A | * | 1/2000 | Butts et al. | 439/76.2 |
| 6,062,916 | A | * | 5/2000 | Gladd et al. | 439/751 |
| 6,079,991 | A | * | 6/2000 | Lemke et al. | 439/83 |
| 6,146,206 | A | * | 11/2000 | Konno et al. | 439/621 |
| 6,272,000 | B1 | * | 8/2001 | Spaunhorst et al. | 361/104 |
| 6,666,722 | B2 | * | 12/2003 | Fukumori et al. | 439/621 |

FOREIGN PATENT DOCUMENTS

| | | |
|---|---|---|
| DE | 298 13 570 U1 | 10/1998 |
| EP | 0 349 152 A2 | 1/1990 |
| JP | 8-203591 | 8/1996 |
| JP | 10-233269 | 9/1998 |
| JP | 11-283712 | 10/1999 |
| JP | 2000-150051 | 5/2000 |

OTHER PUBLICATIONS

Patent Abstracts of Japan, Publication No. 10106653, Apr. 24, 1998, Yazaki Corp.

* cited by examiner

*Primary Examiner*—Anatoly Vortman
(74) *Attorney, Agent, or Firm*—Sughrue Mion, PLLC

(57) ABSTRACT

A plurality of fuse connection terminals (10), each having at one end an insertion portion (11) for the insertion of a fuse terminal, and having at the other end a soldering portion (12) for connection to a circuit board (3), are press-fitted and fixed to a support block (20) at their intermediate portions thereof disposed between the insertion portion (11) and the soldering portion (12). Then, the support block (20) is fixedly secured to the circuit board (3), and the soldering portions (12) of the connection terminals (10) are soldered to the circuit board (3). A crank-shaped bent portion (18) is provided between the press-fitting portion (13) and the soldering portion (12), and projections (14, 15) for transmitting a withdrawal force and an insertion force to the support block (20) are formed respectively at front and rear ends of the press-fitting portion (13).

3 Claims, 6 Drawing Sheets

MOUNTING STRUCTURE OF FUSE CONNECTION TERMINALS ON BOARD

The present application is based on Japanese Patent Application No. 2002-8976, the entire contents of which are incorporated herein by reference.

BACKGROUND OF THE INVENTION

1. Field of the Invention

This invention relates to a mounting structure of fuse connection terminals (which are used for connecting fuses to a circuit board) on the circuit board.

2. Related Art

When fuses are to be mounted on a circuit board, there is, in many cases, used a method in which first, connection terminals (fuse connection terminals), used for connecting the fuses to a circuit board, are soldered to the circuit board, and terminals of the fuses are inserted respectively into insertion portions of these connection terminals, thereby connecting the fuses to the connection terminals.

However, when many fuses are to be mounted collectively on a specified portion of the circuit board, much time and labor are required for mounting the plurality of connection terminals on the board independently of one another, and besides in some cases, the fuses can not be mounted precisely on the board. Furthermore, when inserting and withdrawing the fuse relative to the connection terminal, an insertion/withdrawal force acts directly on a soldering portion of the connection terminal, and therefore there is encountered a problem that the reliability of the soldering portion is adversely affected.

SUMMARY OF THE INVENTION

With the above problems in view, it is an object of this invention to provide a mounting structure of fuse connection terminals on a board, in which the fuse connection terminals can be easily and precisely mounted on the circuit board, and besides when inserting and withdrawing a fuse, a fuse-inserting/withdrawing force will not act directly on a soldering portion of the connection terminal.

(1) A structure of the invention for mounting fuse connection terminals on a board is characterized in that a plurality of fuse connection terminals, each having at one end an insertion portion for the insertion of a fuse terminal thereinto, and also having at the other end a soldering portion for connection to the circuit board, are press-fitted into a support block at their intermediate portions, each disposed between the insertion portion and the soldering portion, so that the fuse connection terminals are fixed to the support block, and then the support block is fixedly secured to the circuit board, and the soldering portions of the fuse connection terminals are soldered to the circuit board.

In this mounting structure, the plurality of fuse connection terminals are first fixedly secured to the support block, and then are mounted on the circuit board, and therefore even when the number of the terminals is large, the fuse connection terminals can be accurately mounted in the proper posture on the circuit board without requiring much time and labor. In addition, the fuse connection terminals are first press-fitted into the support block, and then are soldered to the circuit board, and therefore the fuse-inserting and— withdrawing forces, applied when inserting and withdrawing the fuse relative to the connection terminal, can be transmitted to the support block via the press-connecting portion of the connection terminal. Therefore, the insertion and withdrawal forces can be received by the support block so that the insertion and withdrawal forces will not act directly on the soldering portion.

(2) A structure of the invention for mounting fuse connection terminals on a board is further characterized in that the fuse connection terminal has a crank-shaped bent portion which is provided between a press-fitting portion of the fuse connection terminal for press-fitting into the support block and the soldering portion, and has two L-shaped bent portions, so that the soldering portion is offset with respect to a straight line passing through the insertion portion and the press-fitting portion, and that L-shaped bent portion, disposed close to the press-fitting portion, is spaced from the circuit board.

The fuse inserting/withdrawing force, acting on the fuse connecting terminal, is generally transmitted to the support block via the press-fitting portion, and when an excessive insertion/withdrawal force is applied, there is a possibility that this force elastically deforms the support block, and acts on the soldering portion via the press-fitting portion. Therefore, in the invention, the crank-shaped bent portion is provided between the press-fitting portion and the soldering portion. Therefore, even if the insertion/withdrawal force acts on that portion of the connection terminal extending downwardly from the press-fitting portion, this insertion/withdrawal force can be absorbed by the resilient nature of the crank-shaped bent portion so that this force will not act on the soldering portion. Particularly, that L-shaped bent portion (one of the two L-shaped bent portions of the crank-shaped bent portion), disposed close to the press-fitting portion, is spaced from the circuit board, and therefore this L-shaped bent portion can exhibit a sufficient resilient nature (force-absorbing performance), and an external force is prevented as much as possible from acting directly on the soldering portion.

(3) A structure of the invention for mounting fuse connection terminals on a board is further characterized in that an insertion force-transmitting projection for transmitting an insertion force, acting on the fuse connection terminal when inserting the fuse terminal into the insertion portion of the fuse connection terminal, to the support block is formed at a rear end of the press-connecting portion with respect to a press-fitting direction, and a withdrawal force-transmitting projection for transmitting a withdrawal force, acting on the fuse connection terminal when withdrawing the fuse terminal from the insertion portion of the fuse connection terminal, to the support block is formed at a front end of the press-connecting portion with respect to the press-fitting direction.

When the fuse connection terminal is press-fitted into the support block, the force of fixing the fuse connection terminal is obtained by the friction of the press-fitting portion. However, if the fuse connection terminal depends for its fixing merely on the frictional force, the fixing force may be, in some cases, weak. Therefore, in the invention, the projections are formed at the front and rear ends of the press-fitting portion, respectively, so that the insertion and withdrawal forces, acting on the fuse connection terminal, can be received. In the case where the projections are thus formed at the front and rear ends of the press-fitting portion, respectively, the insertion force-transmitting projection transmits the insertion force to the support block when the fuse terminal is inserted, and therefore the insertion force, acting on the fuse connection terminal, can be positively received by the support block. Also, when the fuse terminal is withdrawn, the withdrawal force-transmitting projection transmits the withdrawal force to the support block, and therefore the withdrawal force, acting on the fuse connection terminal, can be positively received by the support block. Therefore, the fuse-inserting/withdrawing force is effectively prevented from acting directly on the soldering portion.

(4) A structure of the invention for mounting fuse connection terminals on aboard is further characterized in that the fuse connection terminal comprises one strip, and the insertion portion is formed as a tuning fork-shaped terminal portion which is formed by forming a slit in that portion of the strip, disposed centrally of a width thereof, the slit extending from a distal end of the strip.

In this structure, the insertion portion, into which the fuse terminal can be inserted, is formed as the tuning fork-shaped terminal portion, and therefore the insertion portion can be positively brought into electrical contact with the fuse terminal although the structure is simple.

(5) A structure of the invention for mounting fuse connection terminals on a board is further characterized in that the fixing of the support block to the circuit board is effected by one screw provided in a central portion of a mounting surface of the support block to be mounted on the circuit board, and positioning portions for fixing the position of the support block relative to the circuit board in a direction of rotation of the support block about the screw are provided respectively at positions disposed outwardly of the screw, and the positioning portions are disposed point-symmetrically with respect to the screw.

In this structure, the support block is fixed by one screw, and therefore the support block can be easily fixed to the circuit board. If the support block is fastened merely by one screw, the position of this support block in the direction of rotation thereof about the screw is not fixed, and therefore there are provided the positioning portions, and besides the positioning portions are disposed point-symmetrically with respect to the screw, and therefore the support block can be mounted on the circuit board in a 180 degree-turned manner. Thus, there can be provided the two mounting directions.

DETAILED DESCRIPTION OF THE PREFERRED EMBODIMENTS

A preferred embodiment of the present invention will now be described with reference to the drawings.

Figure 1:
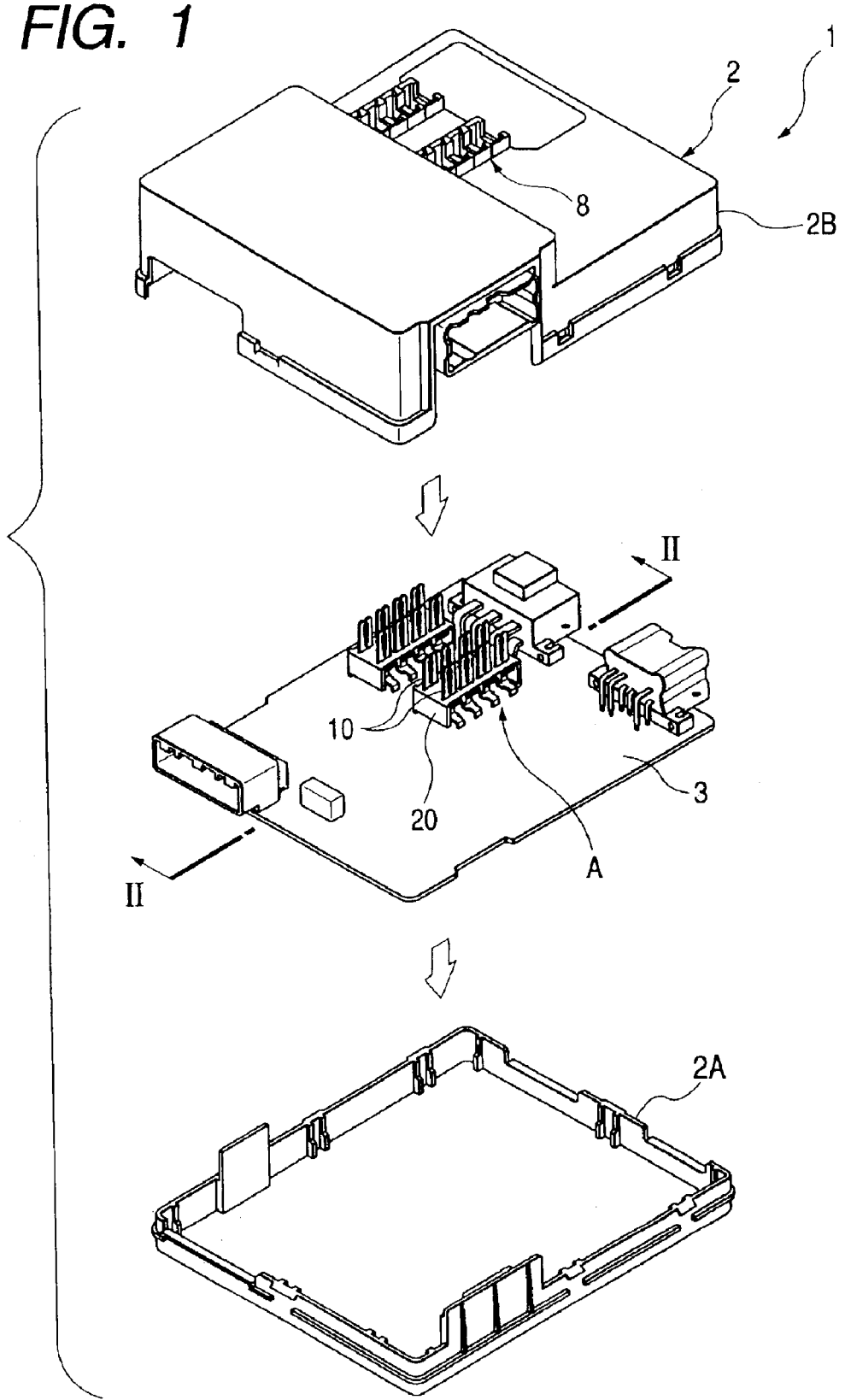
FIG. 1 is an exploded, perspective view showing one example of an electric connection box incorporating a preferred embodiment of a mounting structure of the present invention.
Figure 2:
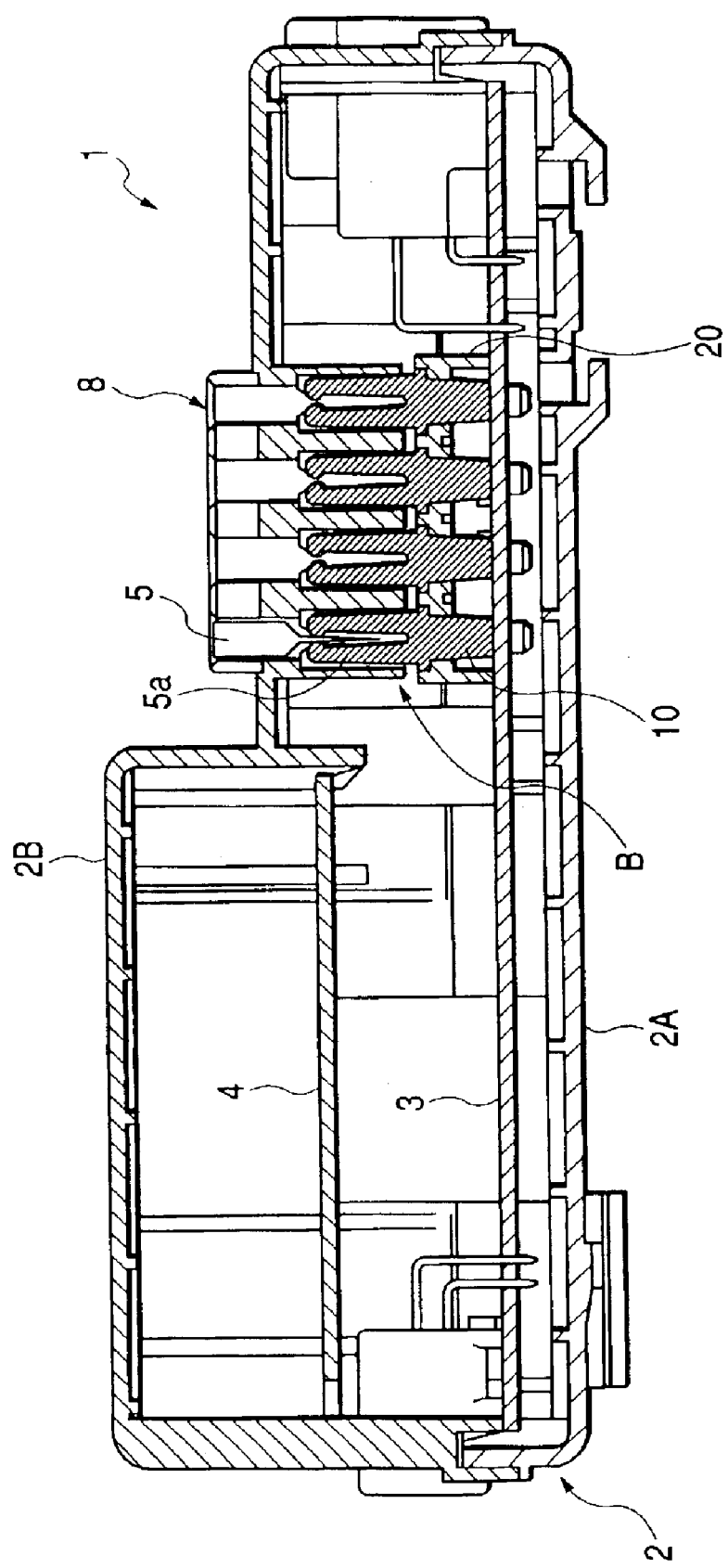
FIG. 2 is a cross-sectional view taken along the line II—II of FIG. 1, showing the electric connection box in its assembled condition.
Figure 3:
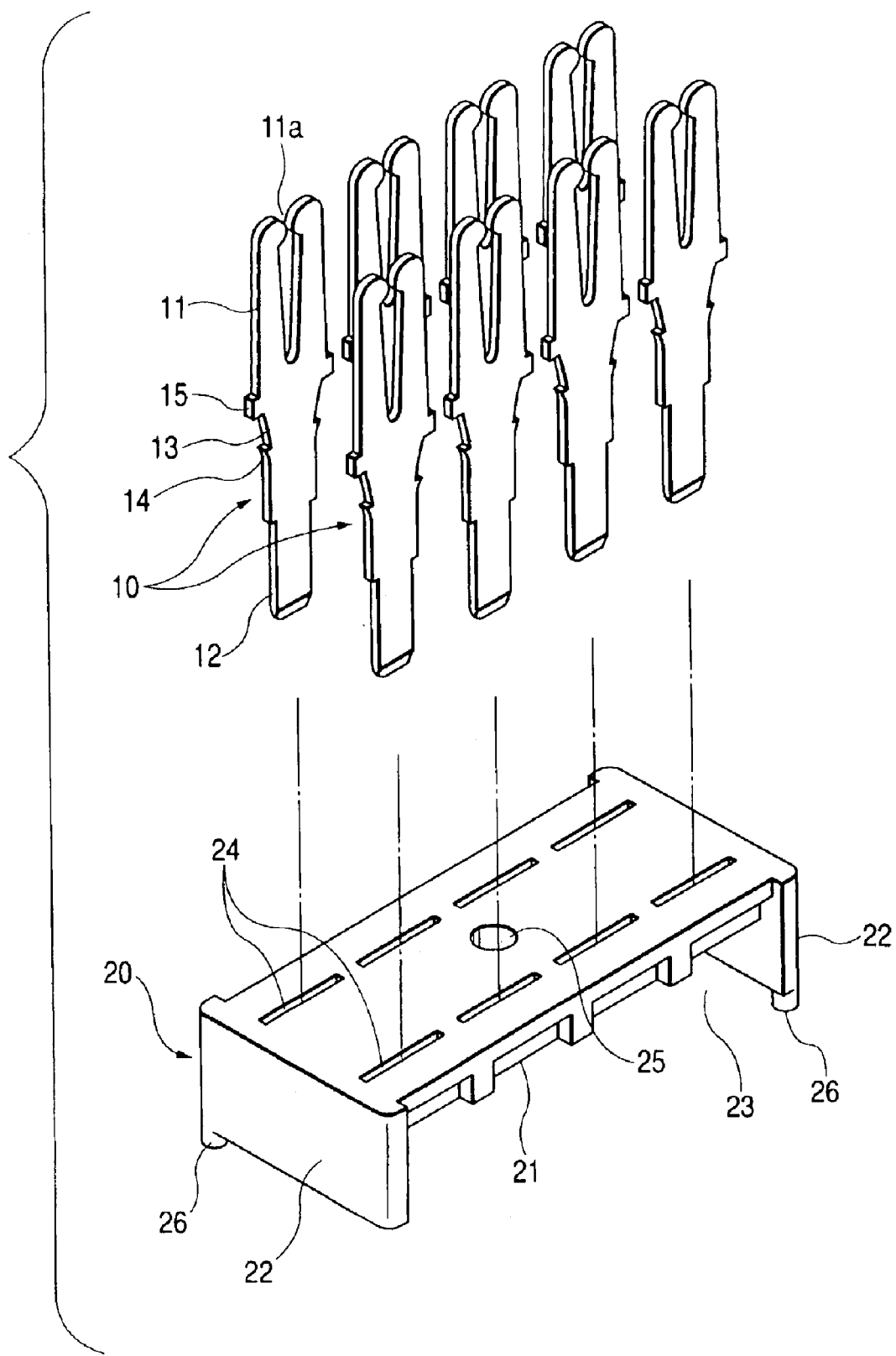
FIG. 3 is a perspective view showing a condition in which a portion A, shown in FIG. 1, is in the process of being produced.
Figure 4:
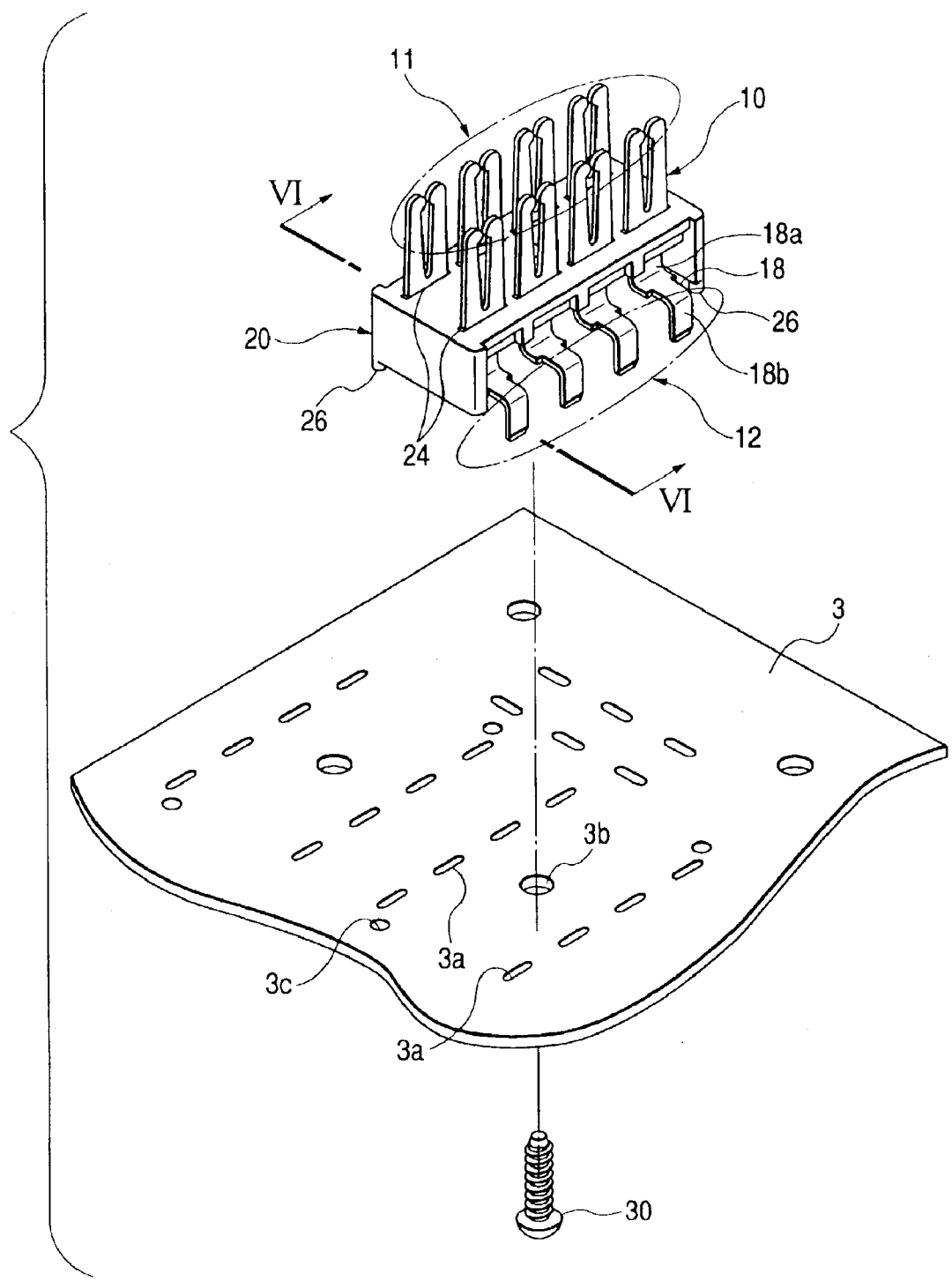
FIG. 4 is an exploded, perspective view of the portion A of FIG. 1.
Figure 5:
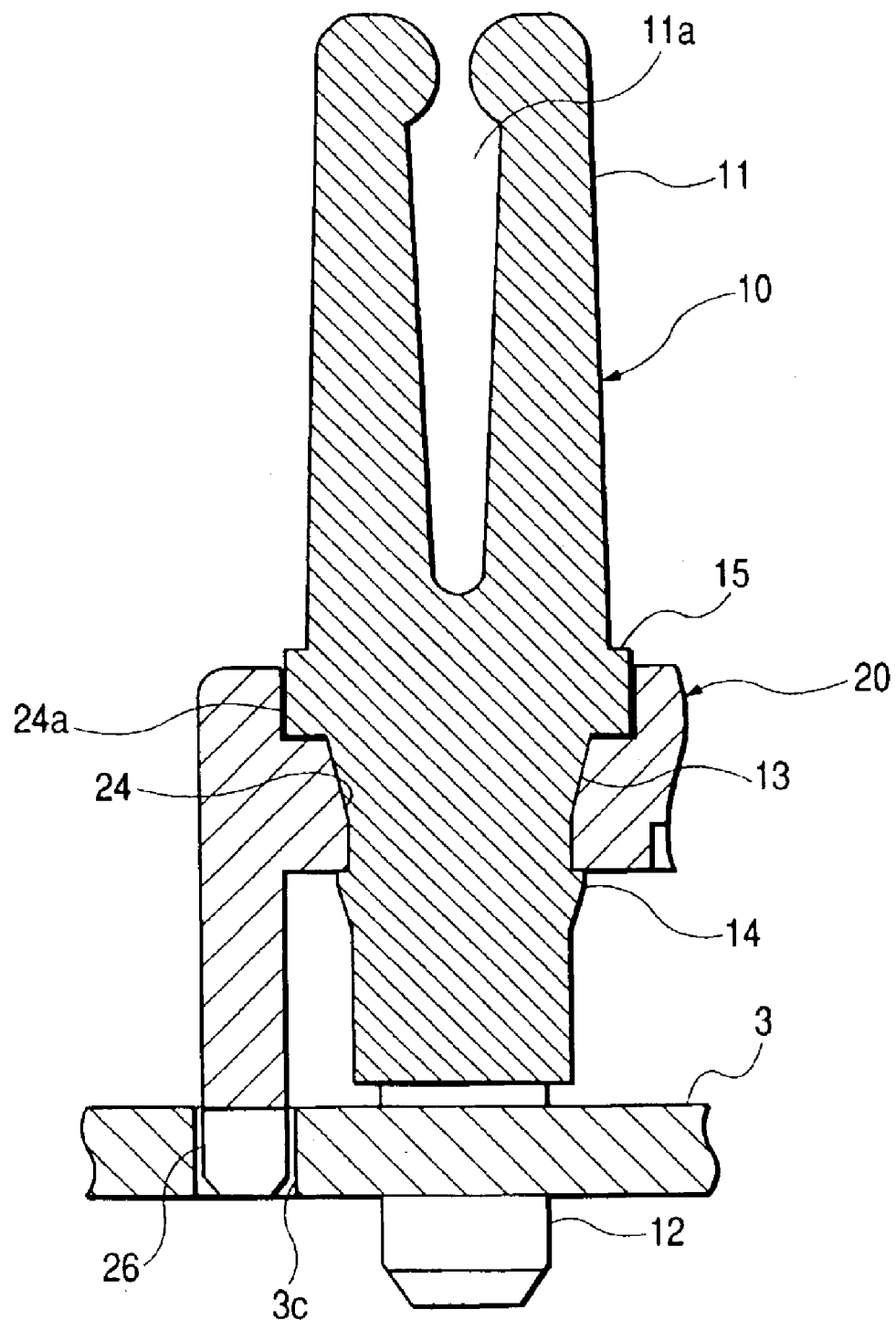
FIG. 5 is an enlarged view of a portion B shown in FIG. 2.
Figure 6:
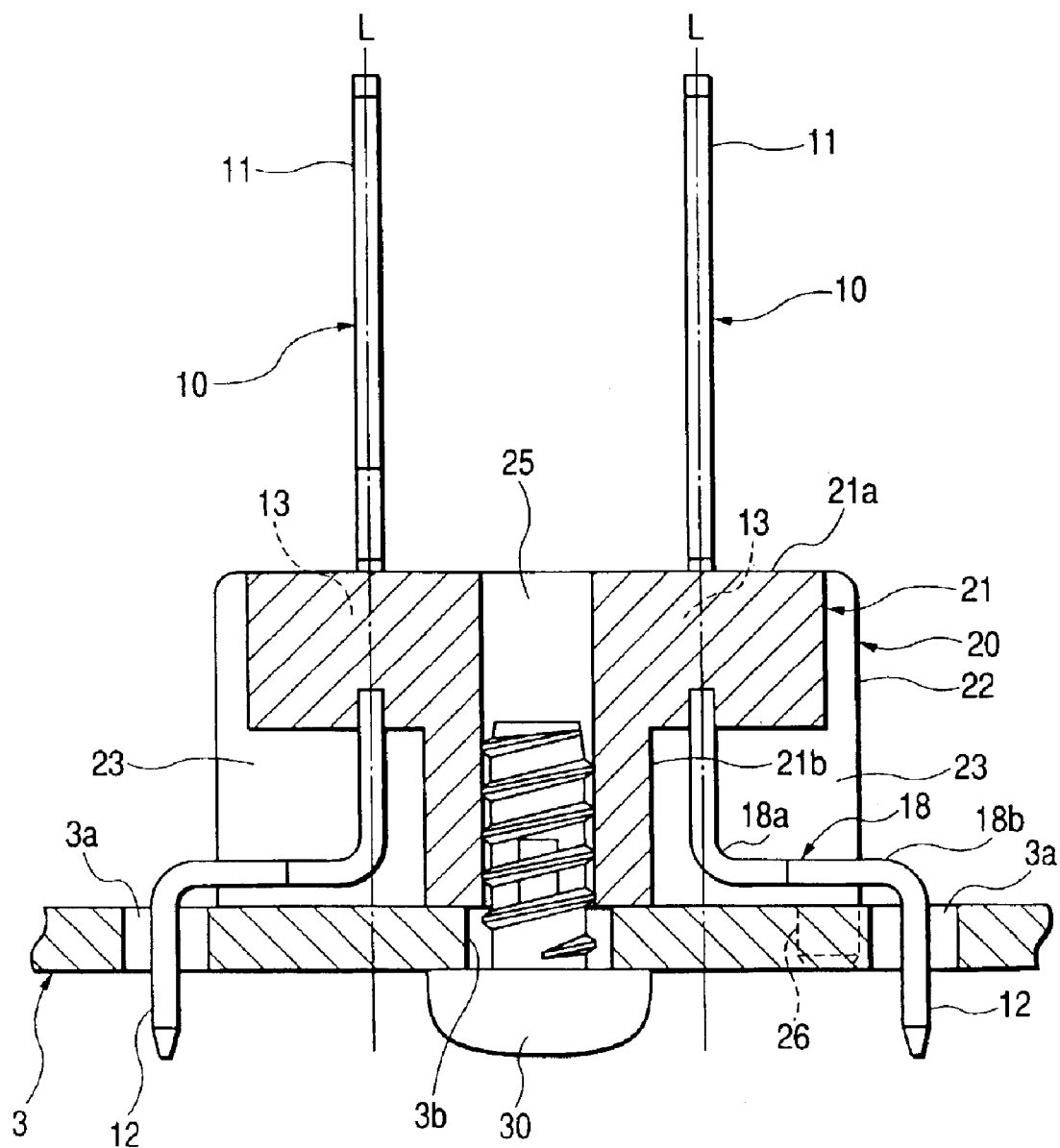
FIG. 6 is a cross-sectional view taken along the line VI—VI of FIG. 4.

FIG. 1 is an exploded, perspective view showing one example of an electric connection box incorporating a mounting structure of this embodiment, FIG. 2 is a cross-sectional view taken along the line II—II of FIG. 1, showing the electric connection box in its assembled condition, FIG. 3 is a perspective view showing a condition in which a portion A, shown in FIG. 1, is in the process of being produced, FIG. 4 is an exploded, perspective view of the portion A of FIG. 1, FIG. 5 is an enlarged view of a portion B shown in FIG. 2, and FIG. 6 is a cross-sectional view taken along the line VI—VI of FIG. 4.

As shown in FIGS. 1 and 2, this electric connection box 1 comprises a casing 2 (which is made of a resin), consisting of a lower casing 2A and an upper casing 2B, and two (first and second) circuit boards 3 and 4 contained in the casing 2. The first circuit board 3 is fitted in the lower casing 2A while the second circuit board 4 is fitted in the upper casing 2B, and the upper casing 2B, having the circuit board 4 fitted therein, is fitted on the lower casing 2A having the circuit board 3 fitted therein, and the upper and lower casings are locked to each other, thereby forming the electric connection box 1 of FIG. 2.

Connection terminals (fuse connection terminals) 10 are soldered to the first circuit board 3 which is to be fitted in the lower casing 2A, and blade terminals 5a of fuses 5 (only one of which is shown in FIG. 2) are inserted respectively into these connection terminals 10 in a direction perpendicular to the circuit board 3, and are connected thereto. In this case, many fuses 5 are connected to the first circuit board 3, and therefore first, many connection terminals 10 are mounted on one support block 20, and then the support block 20 is fixed to the circuit board 3, and in this condition the connection terminals 10, mounted on the support block 20, are soldered to the circuit board 3.

Next, details of the mounting structure of the connection terminals 10 on the circuit board 3 will be described with reference to FIGS. 3 to 6. In FIG. 3, reference numeral 10 denotes the connection terminal of a flat shape which is to be bent into a final shape, and reference numeral 20 denotes the support block on which the connection terminals 10 are to be mounted. The connection terminal 10 has at its upper end an insertion portion 11 for the insertion of the blade terminal (hereinafter referred to merely as "fuse terminal") of the fuse thereinto, and also has at its lower end a soldering portion 12 for connection to the circuit board.

The connection terminal 10 is formed into a strip-like shape by press-cutting, and the insertion portion 11 is formed as a tuning fork-shaped terminal portion which is formed by forming a slit 11a in that portion of the strip, disposed centrally of a width thereof, the slit 11a extending from the distal end of the strip. A press-fitting portion (an intermediate portion) 13 for press-fitting in the support block 20 is provided between the insertion portion 11 and the soldering portion 12 of the connection terminal 10. The direction of press-fitting of the connection terminal 10 is from the upper side of the support block 20 toward the lower side thereof, and the width of the press-fitting portion 13 is increasing gradually from its front end to its rear end with respect to the press-fitting direction (that is, in a direction from the lower end to the upper end in the drawings). First projections 14 are formed at the lower end (front end with respect to the press-fitting direction) of the press-fitting portion 13, and second projections 15 are formed at an upper end (rear end with respect to the press-fitting direction) of the press-fitting portion 13, and these projections 14 and 15 serve to hold the press-fitted connection terminal 10 against movement.

One pair of connection terminals 10 are provided for each fuse, and each pair of connection terminals 10 are arranged in facing relation to each other, with their one sides (faces) opposed to each other. In this case, four fuses are to be connected, and therefore the connection terminals 10 are arranged in two rows each having four connection terminals 10.

The support block 20 comprises a resin-molded product, and as shown in FIGS. 5 and 6, this support block includes a T-shaped wall 21, consisting of an upper wall 21a and a central longitudinal wall 21b, and side walls 22 formed respectively at opposite ends of the T-shaped wall 21. Spaces 23 are formed respectively at the lower sides of opposite side portions of the upper wall 21a projecting respectively from opposite sides of the central longitudinal wall 21b of the T-shaped wall 21. Slits 24 are formed in the upper wall 21a, and each slit extends from the upper side of the upper wall 21a to the corresponding space 23. The connection terminals 10 are press-fitted into these slits 24, respectively, and the slits 24 are arranged in a pattern corresponding to the pattern of arrangement of the connection terminals 10 as shown in FIG. 3. As shown in FIG. 5, an enlarged mouth portion 24a, into which the second projections 15 of the connection terminal 10 can be fitted, is formed at an upper end of the slit 24.

For connecting the connection terminals 10 to the circuit board 3, first, the connection terminals 10 of the flat shape, each to be bent into the final shape, are press-fitted into the support block 20, and are fixed thereto. Namely, the connection terminal 10 is inserted into the slit 24 in such a manner that the soldering portion 12, provided at the lower end thereof, is first introducing into the slit 24, and the press-fitting portion 13 is press-fitted into the slit 24 until the first projections 14 pass through the slit 24, as shown in FIG. 15.

As the connection terminal 10 is thus press-fitted, the hole of the slit 24 in the support block 20, made of a resin, is deformed into a shape corresponding to the shape of the press-fitting portion 13, and finally the first projections 14 of the connection terminal 10 pass through the slit 24, and are engaged with a peripheral edge portion of the outlet of the slit 24 while the second projections 15 are engaged in the enlarged mouth portion 24a at the inlet of the slit 24, as shown in FIG. 5. Here, the second projections 15, which are larger in projecting amount than the first projections 14, are thus engaged in the enlarged mouth portion 24a, and therefore the positioning of the connection terminal 10 in the press-fitting direction is properly effected. The engagement of the first projections 14 with the peripheral edge portion of the outlet of the slit 24 is achieved by the effect that the relevant portion of the material, forming the support block 20, is first slightly deformed outwardly when front slanting portions of the first projections 14 pass through the slit, and then is restored inwardly because of its own elasticity.

When the press-fitting portion 13 of the connection terminal 10 is thus press-fitted into the slit 24, the connection terminal 10 is supported on the support block 20 by a frictional force exerted therebetween. And besides, the connection terminal is engaged with the support block 20 at the front and rear ends of the press-fitting portion 13, and therefore the connection terminal 10 is firmly held against movement in the press-fitting direction and in the direction opposite to the press-fitting direction.

In this case, the press-fitting direction is the direction of insertion of the fuse terminal, and therefore the second projections (insertion force-transmitting projections) 15 serve to transmit an insertion force, applied when inserting the fuse terminal, to the support block 20, and the first projections (withdrawal force-transmitting projections) 14 serve to transmit a withdrawal force, applied when withdrawing the fuse terminal, to the support block 20. And besides, the press-fitting portion 13 is formed such that its width is increasing gradually toward the rear end (front end in the drawings) with respect to the press-fitting direction as shown in FIG. 5, and therefore the insertion force, applied to the fuse terminal, is transmitted to the support block 20 also by a wedging effect of the press-fitting portion 13.

After the press-fitting portion 13 of the connection terminal 10 is thus fitted into the proper position in the support block 20, the lower end portion of each connection terminal 10, projecting into the space 23 in the lower portion of the support block 20, is bent into a crank-shape, thereby forming a crank-shaped bent portion 18 between the press-fitting portion 13 and the soldering portion 12, the crank-shaped bent portion 18 having two L-shaped bent portions 18a and 18b. In this case, the positions of formation of the L-shaped bent portions 18a and 18b are determined in accordance with the position of mounting of the support block 20 relative to the circuit board 3, the positions of through holes 3a in the circuit board 3 and so on.

After the lower end portion of each connection terminal 10 is thus bent into the crank-shape, the support block 20 is placed on the circuit board 3, with the soldering portions 12 of the connection terminals 10 inserted respectively in the corresponding through holes 3a in the circuit board 3, and the support block 20 is fixedly secured to the circuit board 3 by one screw 30. Namely, a screw passage hole 3b and a screw fastening hole 25 are beforehand formed respectively through the circuit board 3 and the T-shaped wall 21 of the support block 20, and the screw 30 is passed through the screw passage hole 3b in the circuit board 3 from the lower side, and is threaded at its front end portion into the screw fastening hole 25 in the support block 20, thereby fixedly securing the support block 20 to the circuit board 3.

In this case, the screw fastening hole 25 is provided in a central portion of a mounting surface of the support block 20 to be mounted on the circuit board 3, and in case the support block is fastened merely by the single screw 30, there is a possibility that the position of the support block 20 in a rotational direction is not fixed. Therefore, positioning projections (positioning portions) 26, formed respectively at lower ends of the side walls 22 of the support block 20, are fitted respectively in positioning holes (positioning portions) 3c in the circuit board 3, thereby positioning the support block 20. In this case, the positioning projections 26, as well as the positioning holes 3c, are disposed point-symmetrically with respect to the screw 30, and therefore the support block 20 can be mounted on the circuit board 3 in a 180 degree-turned manner. In this mounted condition, the soldering portion 12 of each connection terminal 10 is offset with respect to a straight line L passing through the insertion portion 11 and the press-fitting portion 13 as shown in FIG. 6 since the crank-shaped bent portion 18 is provided therebetween. In addition, the L-shaped bent portion 18a, disposed close to the press-fitting portion 13, is spaced from the circuit board 3.

After the support block 20 is thus fixed, the soldering portions 12 of the connection terminals 10, inserted in the respective through holes 3a, are soldered to a printed conductor pattern on the circuit board 3. By doing so, the mounting of the connection terminals 10 through the support block 20 is completed. Then, this first circuit board 3 is fitted into the lower casing 2A shown in FIGS. 1 and 2, and the upper casing 2B, having the second circuit board 4 fitted therein, is fitted on this lower casing, and the two casings are locked to each other, thereby completing the electric connection box 1. In this electric connection box 1, the upwardly-projecting insertion portions 11 of the connection terminals 10 are inserted into a fuse-mounting housing portion 8 of the upper casing 2B, and by doing so, these insertion portions 11 are protected against buckling.

In the mounting structure of the connection terminals 10 on the circuit board 3 (which structure is applied to the electric connection box 1), the plurality of connection terminals 10 are first fixedly secured to the support block 20, and then are mounted on the circuit board 3, and therefore even when the number of the terminals is large, the connection terminals 10 can be mounted in the proper posture on the circuit board 10 without requiring much time and labor.

In addition, the connection terminals 10 are first press-fitted into the support block 20, and then are soldered to the circuit board 3, and besides the projections 14 are formed at the front end of the press-fitting portion 13 while the projections 15 are formed at the rear end of the press-fitting portion 13 so that the fuse-inserting and -withdrawing forces, acting on the connection terminal 10, can be transmitted to the support block 20. Therefore, the insertion and withdrawal forces, applied when inserting and withdrawing the fuse relative to each connection terminal 10, can be positively received by the support block 20. Therefore, the insertion and withdrawal forces will not act directly on the soldering portion 12, and as a result the reliability of the soldering portion 12 is enhanced.

If an excessive insertion/withdrawal force acts on the connection terminal 10, there is a possibility that this force elastically deforms the support block 20, and acts on the soldering portion 12 via the press-fitting portion 13. In the above structure, however, the crank-shaped bent portion 18 is provided between the press-fitting portion 13 and the soldering portion 12, and therefore even if the insertion/withdrawal force acts on that portion of the connection terminal extending downwardly from the press-fitting portion 13, this insertion/withdrawal force can be absorbed by the resilient nature of the crank-shaped bent portion 18. Therefore, this force will not act on the soldering portion. Particularly, the L-shaped bent portion 18a (one of the two L-shaped bent portions 18a and 18b of the crank-shaped bent portion 18), disposed close to the press-fitting portion 13, is spaced from the circuit board 3, and therefore this L-shaped bent portion 18a can exhibit a sufficient resilient nature (external force-absorbing performance), and an external force is prevented as much as possible from acting directly on the soldering portion.

Furthermore, in this structure, the insertion portion 11 of the connection terminal 10, into which the fuse terminal can be inserted, is formed as the tuning fork-shaped terminal portion, and therefore there is achieved an advantage that the insertion portion can be positively brought into electrical contact with the fuse terminal although the structure is simple.

As described above, in the invention, the plurality of fuse connection terminals are first fixedly secured to the support block, and then are mounted on the circuit board, and therefore even when the number of the terminals is large, the fuse connection terminals can be easily and accurately mounted on the circuit board. In addition, the fuse connection terminals are first press-fitted into the support block, and then are soldered to the circuit board, and therefore the insertion and withdrawal forces, applied when inserting and withdrawing the fuse relative to the connection terminal, can be transmitted to the support block so that the insertion and withdrawal forces will not act directly on the soldering portion, and therefore the reliability of the soldering portion is enhanced.

In the invention, the crank-shaped bent portion is provided between the press-fitting portion of the connection terminal for press-fitting into the support portion and the soldering portion so that a certain degree of external force can be absorbed by the resilient nature of this bent portion. Therefore, adverse effects of the external force on the soldering portion can be avoided more positively.

In the invention, the projections are formed at the front and rear ends of the press-fitting portion, respectively, so that the insertion and withdrawal forces, acting on the fuse connection terminal, can be more positively transmitted to the support block. Therefore, the fuse insertion/withdrawal force can be more positively prevented from acting on the soldering portion.

In the invention, the insertion portion, into which the fuse terminal can be inserted, is formed as the tuning fork-shaped terminal portion, and therefore in addition to the foregoing effects of the invention, the insertion portion can be positively brought into electrical contact with the fuse terminal although the structure is simple.

In the invention, in addition to the foregoing effects of the invention, the support block can be fixed to the circuit board by one screw. And besides, there can be selected one of the two mounting positions which are turned 180 degrees relative to each other.

What is claimed is:

1. A mounting structure of fuse connection terminals on a board, comprising:
    a plurality of fuse connection terminals, each having at one end an insertion portion for the insertion of a fuse terminal thereinto, and also having at the other end a soldering portion for connection to the circuit board;
    a support block to which the fuse connection terminals are press-fitted and fixed at intermediate portions thereof disposed between said insertion portion and said soldering portion of each fuse connection terminal,
    wherein said support block is fixedly secured to said circuit board, and
    said soldering portions of said fuse connection terminals are soldered to said circuit board, and
    wherein said fuse connection terminal includes
    a crank-shaped bent portion which is provided between a press-fitting portion of said fuse connection terminal for press-fitting into said support block and said soldering portion, and two L-shaped bent portions,
    whereby said soldering portion is offset with respect to a straight line passing through said insertion portion and said press-fitting portion, and
    wherein said L-shaped bent portion disposed close to said press-fitting portion is spaced from said circuit board.

2. A mounting structure of fuse connection terminals on a board, comprising:
    a plurality of fuse connection terminals, each having at one end an insertion portion for the insertion of a fuse terminal thereinto, and also having at the other end a soldering portion for connection to the circuit board;
    a support block to which the fuse connection terminals are press-fitted and fixed at intermediate portions thereof disposed between said insertion portion and said soldering portion of each fuse connection terminal,
    wherein said support block is fixedly secured to said circuit board, and said soldering portions of said fuse connection terminals are soldered to said circuit board, and wherein an insertion force-transmitting projection is formed at a rear end of said press-connecting portion with respect to a press-fitting direction, and a withdrawal force-transmitting projection is formed at a front end of said press-connecting portion with respect to the press-fitting direction, wherein said insertion force-transmitting projection transmits an insertion force acting on said fuse connection terminal to said support block when said fuse terminal is inserted into said insertion portion of said fuse connection terminal, and said withdrawal force-transmitting projection transmits a withdrawal force acting on said fuse connection terminal to said support block when said fuse terminal is withdrawn from said insertion portion of said fuse connection terminal.

3. A mounting structure of fuse connection terminals on a board, comprising:

a plurality of fuse connection terminals, each having at one end an insertion portion for the insertion of a fuse terminal thereinto, and also having at the other end a soldering portion for connection to the circuit board;

a support block to which the fuse connection terminals are press-fitted and fixed at intermediate portions thereof disposed between said insertion portion and said soldering portion of each fuse connection terminal, wherein said support block is fixedly secured to said circuit board, and said soldering portions of said fuse connection terminals are soldered to said circuit board, and wherein the fixing of said support block to said circuit board is effected by one screw provided in a central portion of a mounting surface of said support block to be mounted on said circuit board, and positioning portions for fixing the position of said support block relative to said circuit board in a direction of rotation of said support block about said screw are provided respectively at positions disposed outwardly of said screw, and said positioning portions are disposed point-symmetrically with respect to said screw.

* * * * *